United States Patent [19]

Kojima et al.

[11] 4,067,100
[45] Jan. 10, 1978

[54] METHOD OF MAKING A SEMICONDUCTOR DEVICE

[76] Inventors: Akira Kojima, 257-2 Sagami-dai, Zama, Kanagawa; Teruaki Aoki, 3-23-8 Kami-Kitazawa, Setagaya, Tokyo; Norio Suzuki, 252-1 Shimo-Kawairi, Atsugi, Kanagawa, all of Japan

[21] Appl. No.: 718,339

[22] Filed: Aug. 27, 1976

[30] Foreign Application Priority Data

Aug. 29, 1975   Japan ............................... 50-104557

[51] Int. Cl.² .................................................. B01J 17/00
[52] U.S. Cl. .......................................... 29/578; 29/580; 29/590; 29/591; 427/91; 156/656; 156/657; 156/659
[58] Field of Search ................. 29/578, 580, 591, 589, 29/590; 427/88, 91; 156/8, 17

[56] References Cited

U.S. PATENT DOCUMENTS

| | | | |
|---|---|---|---|
| 3,287,612 | 11/1966 | Lepselter | 29/578 |
| 3,858,304 | 1/1975 | Leedy | 29/578 |

*Primary Examiner*—W. Tupman
*Attorney, Agent, or Firm*—Hill, Gross, Van Santen, Steadman, Chiara & Simpson

[57] ABSTRACT

A method of making a semiconductor device which has sharp corners on an upper surface and wherein a passivation layer is formed over said surface and windows are formed in the passivation layer for the attaching and formation of electrodes in which a photoresist material is placed over the passivation layer and selectively removed so as to leave areas of photoresist at locations over said passivation layer wherein electrodes are to be formed after which a layer of metal is formed over the surface and the metal and photoresist is removed at those portions where the photoresist layer remained after which passivation the area is etched through the windows in the metal layer and the metal layer is then removed and the electrodes are formed in the windows.

16 Claims, 8 Drawing Figures

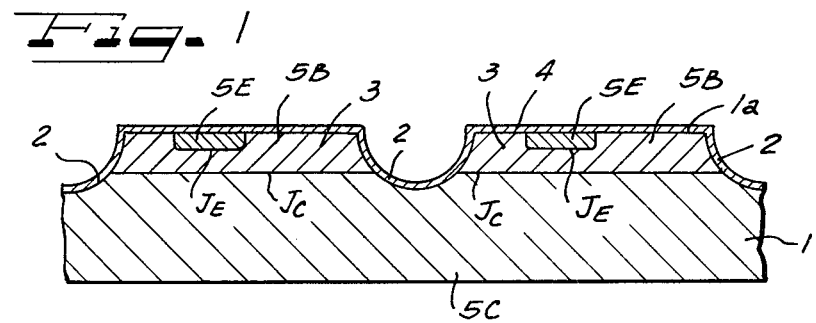
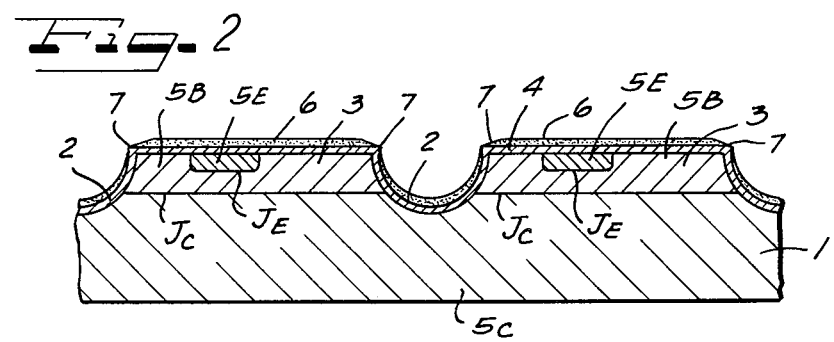
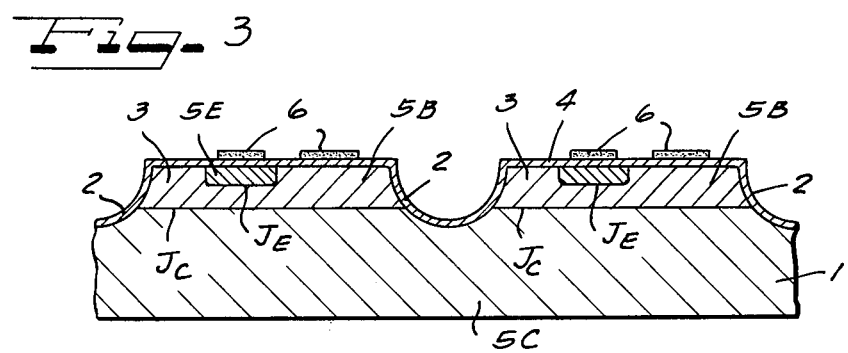
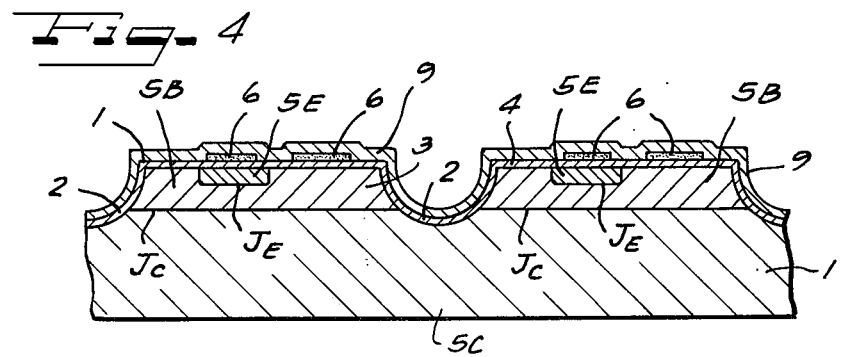

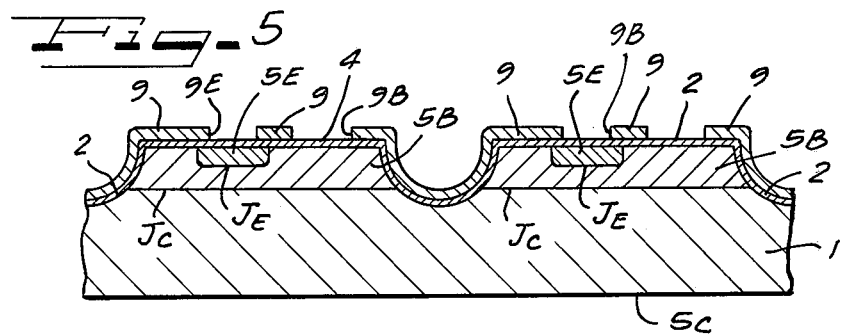
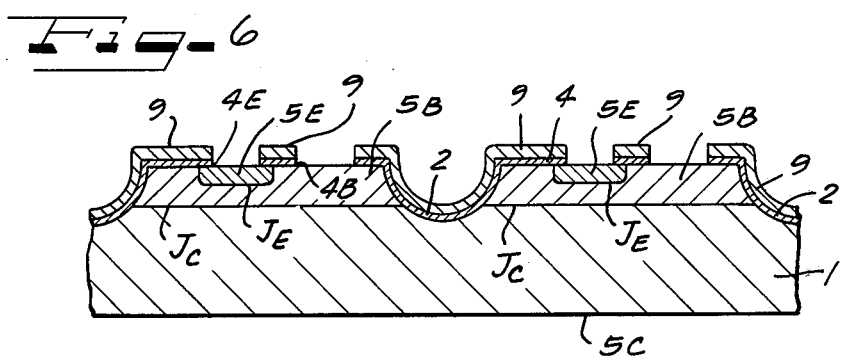
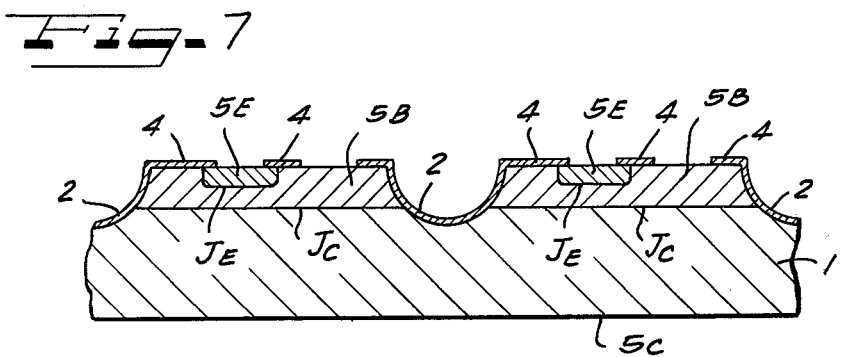
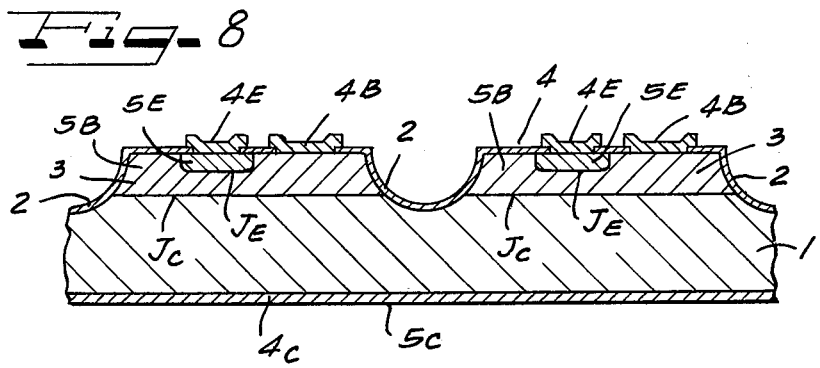

METHOD OF MAKING A SEMICONDUCTOR DEVICE

BACKGROUND OF THE INVENTION

1. Field of the Invention

This invention relates in general to methods for making semiconductor devices especially those having a passivation layer such as a mesa transistor or diode.

2. Description of the Prior Art

Semiconductor devices sometimes have surfaces which are not level and have grooves or ridges formed therein which result in sharp corners or edges being formed on the surface of the semiconductor device. Passivation layers such as silicon dioxide layers or SIPOS layers such as described in copending application Ser. No. 561,532 filed Mar. 24, 1975 entitled "Semiconductor Device" in which the inventors are Takeshi Matsushita et al, are utilized to protect the junction area in the substrate and in making a mesa transistor or diode it is necessary to form windows in the passivation layer so as to attach an electrical contact through the window. In the prior art photo-etching processes it has been known to make such windows through the passivation layer, however, such process is not feasible with the mesa transistors or diodes which have an uneven surface because the photoresist layer tends to become too thin at the corners or edges and thus when etching occurs the passivation layer is not protected by the thin photoresist layer and is removed which is undesirable. The photoresist is applied to the surface of a semiconductor wafer as it is rotated by a spinner at high speed on a mandrel and becomes very thin on sharp corners of a surface of a transistor with grooves and ridges, and, thus, the passivation layer using such prior art techniques would be undesirably removed using such conventional methods.

SUMMARY OF THE INVENTION

In the present invention, photoresist is not directly used for etching the passivation layer, rather the photoresist is selectively removed so that it remains on the areas where the windows are to be formed for the electrodes after which a metal layer is coated over the photoresist and passivation layer and such metal has good etching resistance. Then the metal layer and the photoresist is removed using ultrasonic techniques or other methods such that the metal layer provides an etching mask with good etching resistance for etching windows through the passivation layer. After the windows are etched through the passivation layer, the metal etching mask is removed and the electrodes are formed in the windows of the passivation layer.

Thus, it is an object of the present invention to provide a method for forming windows in a passivation layer of a surface of a substrate which is not planar but has irregularities formed therein so that the remaining portions of the passivation layer will not be deteriorated during the process.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

FIG. 1 is a sectional view of a semiconductor device with an irregular surface and a passivation layer formed thereon;

FIG. 2 is a sectional view of the semiconductor device of FIG. 1 with a photoresist layer formed thereon;

FIG. 3 is a sectional view of the semiconductor device with portions of the photoresist layer removed;

FIG. 4 is a sectional view of the semiconductor device with a metal layer formed over the surface of the semiconductor device;

FIG. 5 illustrates portions of the metal layer and the photoresist layers removed;

FIG. 6 is a sectional view after the passivation has been etched through the metal layer;

FIG. 7 illustrates the semiconductor device after the metal layer has been removed; and FIG. 8 is a sectional view after the electrodes have been formed on the device.

DESCRIPTION OF THE PREFERRED EMBODIMENTS

FIG. 1 is a sectional view through a semiconductor wafer 1 having an irregular major surface 1a formed with grooves 2 which separate mesa regions 3. Each mesa region 3 is provided with a collector region 5c and a base region 5B with a collector junction $J_c$ therebetween. Emitter regions 5E are formed in the base regions 5B and emitter junctions $J_E$ are formed therebetween as shown. The passivation layer 4 of silicon dioxide or SIPOS is formed over the major surface 1a including the grooves 2. The object of the present invention is to provide windows in the passivation layer 4 so as to attach emitter and collector electrodes through such windows without removing the passivation layers at other portions and particularly at the sharp points 7 formed adjacent the edges of the grooves 2.

For accomplishing this, a photoresist layer 6 is formed over the passivation layer 4 as shown in FIG. 2. The photoresist 6 may be OMR-83 a trade name of the Tokyo Ohka Kogyo Co. Ltd. which is coated on the surface 1a of the wafer 1 after which the wafer is rotated at a speed of 2,000 rpm by suitable spinning devices. Due to the high speed spinning so as to distribute the photoresist 6 thin portions of the photoresist exist on the corners or edges 7 of the grooves 2 as illustrated in FIG. 2. In prior art methods wherein the photoresist is directly used as an etching mask for etching the passivation layer 4 the thin areas 7 are also etched and the passivation layer is removed at such sharp corners so as to undesirably destroy the passivation layer at such points.

The present invention prevents this by not using the photoresist layer 6 as an etching mask but utilizes a metal layer as an etching mask. In FIG. 3, the photoresist layer 6 is selectively removed and in the particular example the photoresist may be of a negative type and the photoresist is exposed and developed and removed at all areas except where the emitter and collector electrodes are to be formed. Such selective removal of the photoresist layer is illustrated in FIG. 3.

Then a relatively thick metal layer 9 is deposited over the surface 1a over the passivation layer 4 and the portions of the photoresist layer 6 which define the emitter and collector electrodes.

As shown in FIG. 4, the thickness of the metal layer 9 is selected to be more than 5,000 A so as to assure that there will not be thin or missing portions of the metal layer on the edges or corners 7 where the sharp edges occur. Also, the wafer 1 is rotated during vapor deposition of the metal so as to prevent such defects.

Examples of the metal layer 9 are an aluminum layer of 1 micron thickness or a layer of molybdenum of 1 micron thickness which can be deposited by the dry etching or plasma method. Alternatively, rather than putting single layers of metals of aluminum or molybdenum multi-layer of gold or platinum on chromium can be applied by wet etching process so as to form the layer 9 as two layers. Where multi-layer of gold or platinum on chromium is utilized the gold or platinum is formed to be 0.5 microns in thickness and the chromium is 0.1 microns in thickness.

After the metal layer 9 is formed over the surface of the semiconductor substrate, the photoresist regions 6 remaining over the emitter and collector are removed with the metal layer in the following manner. The wafer 1 is soaked in a photoresist stripper, as for example, photoresist strip J-100 which is a tradename of Indust-Ri-ChemLabratory, a United States company, which is heated to the range of 120° to 130° C and is subjected to supersonic vibration after which the photoresist layer is peeled from the surface of the semiconductor substrate because it swells. It is to be realized, of course, that the metal layer 9 over the photoresist regions 6 is also removed during this process.

Another method for removing the metal layer in the photoresist is to heat the wafer 1 for about 1 to 2 minutes at a temperature of more than 340° C in an inert gas, as for example, nitrogen gas or forming gas so as to deteriorate the adhesive force to the photoresist and then peeling it off with the use of a pressure sensitive adhesive tape stuck over the metal layer 9 so as to remove the photoresist layer 9 and portions of the metal layer 9 formed over the photoresist layer 6. FIG. 5 illustrates the substrate after the photoresist and the metal layer overlying the photoresist have been removed.

Then the passivation layer 4 is etched in the windows formed in the metal layer 9 so as to remove the passivation layer 4 on the surface of the substrate in the windows formed in the metal layer 9 and this is illustrated in FIG. 6 after the passivation layer has been removed by etching.

The etching is accomplished with a first method if the metal layer is aluminum or molybdenum (the dry process) in the following manner. The passivation layer 4 is etched by plasma etching using carbon tetrafluoride $CF_4$ through windows 9E and 9B of the metal layer 9 so as to form windows 4E and 4B as illustrated in FIG. 6. The aluminum or molybdenum layer has good adhesion to the passivation layer 4 and serves as a good mask for the dry plasma etching process.

A second method where the metal layer is a double layer of gold or platinum with chromium (the wet process) and in which first chromium is formed and then gold on top or chromium formed and platinum on top, the passivation layer is etched with a conventional etchant for silicon dioxide, as for example, a mixture of $NH_4F-H_2O-HF$.

Chromium provides good adhesion to various kinds of passivation layers such as ($SiO_2$, $Si_3N_4$, $Al_2O_3$, SIPOS etc.) and has a good resistance against etchants for the passivation layers. However, it is difficult to deposit a thick chromium layer and therefore it is desirable to deposit gold or platinum layers over the chromium layer so that the thick metal layer is formed at the edges 7 of the mesa 3 so as to prevent etchants from etching through the passivation layer at such sharp corners.

After the passivation layer has been etched as illustrated in FIG. 6, the metal layer is removed by the following methods. The method for removing aluminum or molybdenum are as follows. For aluminum, hot phosphoric acid, hydrochloric acid or aqua regia are used. For removing molybdenum, a solution of ceric ammonium nitrate which has the form of $Ce(NO_3)_4 \cdot 2NH_4NO_3 \cdot xH_2O$ including a small amount of nitric acid $HNO_3$ is used. A second method for removing the double layer of chromium and gold or platinum is as follows. The gold or platinum layer is etched by aqua regia and then the chromium layer is etched by a mixed solution of ceric ammonium nitrate and perchloric acid.

After the metal layer has been removed as shown in FIG. 7, the base and emitter contacts 4E and 4B are formed through the windows, as for example, by depositing a layer of aluminum over the passivation layer and selectively etching the layer so as to form the emitter and base electrodes as shown in FIG. 8. A collector electrode 4c is provided on the collector surface 5c after which the wafer 1 can be divided into different pieces of mesa transistors.

In this invention, the windows for forming the emitter and base electrodes are formed by removing the photoresist layer with the metal layer over it and therefore the thickness of the metal 9 can be selected to be thick enough to serve as an etching mask. If the passivation layer 4 is etched by conventional photo etching process methods to form the emitter and base window the thin portions of the passivation layer at the sharp corner 7 will also be removed and thus the passivation layer will be undesirably removed at these points.

It is seen that this invention provides a new and novel method for forming a semiconductor device and although it has been described with respect to preferred embodiments it is not to be so limited as changes and modifications may be made therein which are within the full intended scope as defined by the appended claims.

We claim as our invention:

1. A method of making a semiconductor device comprising the steps of providing a semiconductor body having two major surfaces, one of said surfaces having a plurality of plane surface areas surrounded by recesses and being covered with a passivation layer forming a photoresist layer in a predetermined pattern on said plane surface areas forming a metal layer on said passivation layer and said photoresist layer, removing said photoresist layer together with those portions of said metal layer formed directly thereon to form windows and removing said passivation layer by etching through said windows, further comprising the steps of removing said metal layer, and forming a metal electrode layer on the areas exposed by said etching step.

2. A method claimed in claim 1 wherein said etching is a chemical etching.

3. A method claimed in claim 1 wherein said etching is a dry etching.

4. The method of forming electrodes on a semiconductor substrate having an uneven surface covered by a passivation layer comprising the steps of covering said passivation layer with a photoresist layer and selectively exposing and developing said layer to leave photoresist on those areas where said electrodes are to be formed, coating said passivation layer and photoresist areas with a layer of metal, removing said photoresist areas and metal layer overlying said photoresist areas to form windows, etching through said passivation layer in said windows, removing the remaining portions of said metal layer, and forming metal electrodes in said windows in said passivation layer.

5. The method of claim 4 wherein said metal electrodes are formed by coating a second metalic layer over said passivation layer and said windows and selectively removing said second metalic layer from said passivation layer.

6. The method of claim 4 wherein said layer of metal is aluminum.

7. The method of claim 4 wherein said layer of metal is molybdenum.

8. The method of claim 4 wherein said layer of metal is formed of two layers comprising a layer of gold on chromium.

9. The method of claim 4 wherein said layer of metal is formed of two layers comprising a layer of platinum on chromium.

10. The method of claim 4 wherein said photoresist areas and metal layer overlying said photoresist areas are removed by emersing in a photoresist stripper heated to 120°–130° centigrade and subjecting the areas and layer to supersonic vibrations and peeling said areas and layer from said substrate.

11. The method of claim 4 wherein said photoresist areas and metal layer overlying said photoresist areas are removed by heating and substrate more than one minute to a temperature greater than 340° centigrade in an inert gas, then applying pressure sensitive tape to said metal layer on said substrate surface and removing said pressure sensitive tape.

12. The method of claim 4 wherein said layer of metal is aluminum or molybdenum and said passivation layer is etched by plasma etching using carbon tetrafluoride.

13. The method of claim 4 wherein said layer of metal is formed of two layers of either gold of platinum on chromium and is etched with an etchant comprising a mixture of $NH_4F$-$H_2O$-$HF$.

14. The method of claim 6 wherein said remaining portions of said metal layer are removed with hot phosphoric acid, hydrochloric acid or aqua regia.

15. The method of claim 7 wherein said remaining portions of said metal layer are removed with a solution of ceric ammonium nitrate $Ce(NO_3)_4 \cdot 2NH_4NO_3 \cdot xH_2O$ including a small amount of nitric acid, $NHO_3$.

16. The method of claim 4 wherein said layer of metal is formed of two layers comprising gold or platinum on chromium and said remaining portions of said metal layer are removed by etching said gold or platinum with aqua regia and said chromium layer with a mixed solution of ceric ammonium nitrate and perchloric acid.

* * * * *